US007622153B2

(12) United States Patent
Rollick

(10) Patent No.: US 7,622,153 B2
(45) Date of Patent: Nov. 24, 2009

(54) METHOD OF MAKING VAPOUR DEPOSITED OXYGEN-SCAVENGING PARTICLES

(75) Inventor: Kevin L. Rollick, Munroe Falls, OH (US)

(73) Assignee: M&G USA Corporation, Apple Grove, WV (US)

(*) Notice: Subject to any disclaimer, the term of this patent is extended or adjusted under 35 U.S.C. 154(b) by 580 days.

(21) Appl. No.: 11/196,552

(22) Filed: Aug. 3, 2005

(65) Prior Publication Data

US 2006/0033078 A1 Feb. 16, 2006

Related U.S. Application Data

(60) Provisional application No. 60/601,268, filed on Aug. 13, 2004.

(51) Int. Cl.
| C23C 16/00 | (2006.01) |
| C23C 16/22 | (2006.01) |
| C23C 14/00 | (2006.01) |
| C23C 18/00 | (2006.01) |
| B05D 7/00 | (2006.01) |
| B05D 13/02 | (2006.01) |
| C02F 1/70 | (2006.01) |

(52) U.S. Cl. .......... 427/255.28; 427/213; 427/216; 427/255.23; 427/255.39; 427/255.395; 419/10; 252/188.28; 252/181.6; 75/230; 75/246; 75/366; 75/367; 75/10.17; 75/10.18; 75/443; 75/444

(58) Field of Classification Search ............ 252/188.28; 427/255.28
See application file for complete search history.

(56) References Cited

U.S. PATENT DOCUMENTS

| 2,843,455 | A | * | 7/1958 | Pardee | 423/112 |
| 2,955,957 | A | * | 10/1960 | Dorner | 427/253 |
| 3,211,572 | A | * | 10/1965 | Globus | 427/253 |
| 4,127,503 | A | | 11/1978 | Yoshikawa et al. | |
| 5,089,323 | A | | 2/1992 | Nakae et al. | |
| 5,658,614 | A | * | 8/1997 | Basta et al. | 427/253 |
| 5,796,018 | A | | 8/1998 | Moyer et al. | |
| 6,589,331 | B2 | * | 7/2003 | Ostertag et al. | 106/460 |
| 7,037,875 | B2 | * | 5/2006 | Hu et al. | 502/304 |
| 7,166,323 | B2 | * | 1/2007 | Chung et al. | 427/180 |
| 7,273,635 | B2 | * | 9/2007 | Purvis et al. | 427/250 |
| 2002/0134282 | A1 | * | 9/2002 | Ostertag et al. | 106/459 |
| 2004/0009873 | A1 | | 1/2004 | Dong et al. | |
| 2004/0038069 | A1 | * | 2/2004 | Warnes et al. | 428/650 |
| 2005/0069642 | A1 | * | 3/2005 | Purvis et al. | 427/248.1 |
| 2005/0202968 | A1 | | 9/2005 | Hekal | |
| 2005/0287090 | A1 | * | 12/2005 | Bujard | 424/63 |
| 2007/0020456 | A1 | * | 1/2007 | Solovyov | 428/403 |

FOREIGN PATENT DOCUMENTS

JP        11-302706        11/1999

* cited by examiner

*Primary Examiner*—Joseph D Anthony
(74) *Attorney, Agent, or Firm*—Edwin A. Sisson at Law, LLC.

(57) ABSTRACT

This invention discloses a method of making an oxygen scavenging particle comprised of an activating component and an oxidizable component wherein one component is deposited upon the other component from a vapour phase and is particularly useful when the activating component is a protic solvent hydrolysable halogen compound and the oxygen scavenging particle is a reduced metal.

45 Claims, 1 Drawing Sheet

METHOD OF MAKING VAPOUR DEPOSITED OXYGEN-SCAVENGING PARTICLES

CROSS-REFERENCES TO RELATED APPLICATIONS

This patent application claims the benefit of the priority of U.S. Provisional Patent Application Ser. No. 60/601,268 filed 13 Aug. 2004, all the teachings of which are incorporated herein.

BACKGROUND OF THE INVENTION

1. Field of the Invention

This invention relates to oxygen scavenging particles and manufacturing methods thereof having utility in packaging, particularly suitable for incorporation into film-forming polymers, preferably aromatic polyester resins and the wall of a container made from the aromatic polyester containing the scavenging particle.

2. Description of Related Art

Products sensitive to oxygen, particularly foods, beverages and medicines, deteriorate or spoil in the presence of oxygen. One approach to reducing these difficulties is to package such products in a container comprising at least one layer of a so-called "passive" gas barrier film that acts as a physical barrier and reduces or eliminates the transmission of oxygen through the container wall but does not react with oxygen.

Another approach to achieving or maintaining a low oxygen environment inside a package is to use a packet containing a rapid oxygen absorbent material. The packet, also referred to as a pouch or sachet, is placed in the interior of the package along with the product. The oxygen absorbent material in the sachet protects the packaged product by reacting with the oxygen before the oxygen reacts with the packaged product.

Although oxygen absorbents or scavenger materials used in packets react chemically with the oxygen in the package, they do not prevent external oxygen from penetrating into the package. Therefore, it is common for packaging using such packets to include additional protection such as wrappings of passive barrier films of the type described above. This adds to product costs.

In view of the packet or sachet's disadvantages and limitations, it has been proposed to incorporate an "active" oxygen absorbent, i.e. one that reacts with oxygen, directly into the walls of a packaging article. Because such a packaging article is formulated to include a material that reacts with the oxygen permeating through its walls, the package is said to provide an "active-barrier" as distinguished from a passive barrier that merely blocks the transmission of oxygen but does not react with it. Active-barrier packaging is an attractive way to protect oxygen-sensitive products because it not only prevents oxygen from reaching the product from the outside, it can also absorb oxygen present within a container wall, and absorb the oxygen introduced during the filling of the container.

One approach for obtaining active-barrier packaging is to incorporate a mixture of an oxidizable metal (e.g., iron) and an activating component which promotes the reaction of the metal with oxygen, often in the presence of water, into a suitable film-forming polymer. Examples of activating components are electrolytes (e.g., sodium chloride), acidifying components, electrolytic acidifying components, or protic solvent hydrolysable halogen compounds' like Lewis acids (e.g. aluminum chloride). In the case of nano-metals, little or no activating component may be needed due their inherent pyrophoricity.

The scavenger containing film forming polymer is then melt processed into a monolayer or multilayer article such as a preform, bottle, sheet or film that eventually forms the resulting oxygen scavenger-containing wall or walls of the rigid or flexible container or other packaging article. It will be understood that a film-forming polymer is one that is capable of being made into a film or sheet. The present invention is not, however, limited to films and sheets. Examples of such film forming polymers are polyamides, polyethylenes, polypropylenes, and polyesters.

The container of the present invention also includes bottle walls, trays, container bases, or lids. It should be appreciated that references to the container sidewall and container wall also refer to the lid, bottom and top sides of the container, and a film that may be wrapped around the product such as meat wraps.

One difficulty with scavenger systems incorporating an oxidizable metal or metal compound and an electrolyte into a thermoplastic layer is the inefficiency of the oxidation reaction. High loading of scavenger compositions and relatively large amounts of electrolyte are often used to obtain sufficient oxygen absorption scavenging rate and capacity in active-barrier packaging.

According to U.S. Pat. No. 5,744,056, oxygen-scavenging compositions that exhibit improved oxygen-absorption efficiency relative to systems such as iron and the electrolyte sodium chloride are obtainable by including a non-electrolytic, acidifying component in the composition. In the presence of moisture, the combination of the electrolyte and the acidifying component promotes the reactivity of metal with oxygen to a greater extent than does either alone. However, the acidifying component when used alone does not exhibit sufficient oxygen-scavenging properties.

A particularly preferred oxygen-scavenging composition according to the U.S. Pat. No. 5,744,013 comprises iron powder, sodium chloride and sodium acid pyrophosphate, in amounts from about 10 to 150 parts by weight of sodium chloride plus sodium acid pyrophosphate per hundred parts by weight iron.

These conventional scavenging compositions are created by dry blending the ingredients or depositing the acidifying agents and salts onto the metal particle out of an aqueous liquid or slurry and then regrinding the composition, thus creating more particles.

U.S. Pat. No. 5,744,056 teaches that the degree of mixing of the oxidizable metal, electrolyte and acidifying components and, if used, optional binder component has been found to affect oxygen absorption performance of the oxygen-scavenging compositions, with better mixing leading to better performance. Mixing effects are most noticeable at low electrolyte plus acidifying components to oxidizable metal component ratios and at very low and very high acidifying component to electrolyte component ratios. Below about 10 parts by weight electrolyte plus acidifying components per hundred parts by weight metal component, or when the weight ratio of either the electrolyte or acidifying component to the other is less than about 10:90, the oxygen scavenger components are preferably mixed by aqueous slurry mixing followed by oven drying and grinding into fine particles. Below these ratios, mixing by techniques suitable at higher ratios, such as by high-intensity powder mixing, as in a Henschel mixer or a Waring powder blender, or by lower intensity mixing techniques, as in a container on a roller or tumbler, may lead to variability in oxygen uptake, particularly when the compositions are incorporated into thermoplastic resins and used in melt processing operations. Other things being equal, U.S. Pat. No. 5,744,056 claims that oxygen-scavenging compositions prepared by slurry mixing have the highest oxygen absorption efficiency or performance, followed in order by compositions prepared using high intensity solids mixers and roller/tumbler mixing techniques.

U.S. Pat. No. 4,127,503 teaches the dissolution of an electrolyte in water, contacting the solution with the oxidizable component (e.g. iron) and then removing the water from the composition. While this technique is suitable for salts which dissolve into water, it is not suitable for salts which hydrolyze in the presence of a protic solvent, such as water. Aluminum chloride for instance, will hydrolyze in the presence of water to hydrochloric acid and aluminum hydroxide.

Incorporation of dry blends into the wall of clear containers is difficult because of the haze and colour brought on by the number of discrete particles. U.S. Patent Applications 20030027912, 20030040564, and 20030108702, teach that using larger oxidizable particles minimizes the number of particles and improves the haze and colour of the transparent wall of the container. As taught by these patent applications, the goal of oxygen scavenging compositions should be to have as few particles as possible.

Another deficiency of using dry blended or ground conventional oxidizable metal compositions is the growth of the particle as it oxidizes. It has been observed that as the particle oxidizes, the oxidized material blooms away from the particle making the particle appear larger over time and the colour shifts towards the colour of the oxidized metal. In the case of iron, the colour of the container wall shifts to yellow and yellow orange (rust).

Beverage or food containers presenting the above blooms are commercially unacceptable because the consumer incorrectly attributes the colour to deterioration of the product inside the container.

European Patent Application EP-1 506 718 titled Oxygen Scavenging Compositions and the Application thereof in Packaging Containers filed Aug. 14, 2003 and World Patent Application WO-2005/016 762 titled "Oxygen-scavenging compositions and the application thereof in packaging and containers" submitted on Aug. 11, 2004 teaches that certain protic solvent hydrolysable activating components can be placed onto the oxidizable component by dissolving the activating component into an essentially moisture free organic solution, contacting the solution with the oxidizable metal then removing the solvent.

While the deposition of compounds from a liquid phase achieves the desired intimacy of contact for a unitary particle, liquid phase deposition presents several problems. First, there are the impurities of the solvent or reaction products of the salt with the solvent, often called adducts. These may or may not be bound into the composition. Second, the liquid phase deposition requires a dissolution step and a solvent removal step.

A third drawback of liquid deposition is that the penetration of the liquid into the pores of many metal particles may be inhibited by the surface tension of the liquid.

Yet, another deficiency of liquid deposition is the instability of the liquid deposited composition during further heat processing of the polymer containing the liquid deposited oxygen scavenger. In the case of polyesters, it is advantageous to place the scavenger into the low molecular material and then subject the polymer to solid state processing often at 225° C. for 16-20 hours. As discussed later, bottles and preforms made from polymer containing a liquid deposited oxygen scavenger were unacceptably yellowed relative to the particles made from this invention.

Japanese Patent Application 09-237232 also describes depositing the activating component from an aqueous or organic solution and placing it into the wall of a container. The container wall of Japanese Publication Number 11-080555 (Patent Application 09-237232) is a laminate of metal foil and plastic containing the oxygen scavenger lying between the foil and the package contents. The container is thus non-transparent and any advantage of reducing the number of scavenging particles is not appreciated.

Reacting the outer surface of the iron particle with a compound in a vapour stream is another way to achieve intimate contact. Japanese Publication Number 11-302706 (Application Number 10-131379), titled "Iron Powder For Reactive Material and Its Production" teaches placing an enveloping layer containing 0.1-2% of the weight of chlorine in the iron powder which the enveloping layer which becomes a front face of [sic] ferric chloride by contacting hot chlorine or hydrogen chloride gas to iron powder. This way the ferric chloride is made to form in the front face of said iron powder.

Although this vapour phase-solid phase reaction creates intimacy of contact, it limits one to the reaction products of iron and various gasses. Because this particular Japanese disclosure requires that the oxidizing agent be a reaction product of iron, the practitioner is limited by the kinetics of the iron based salts and iron. Dissimilar metals such as aluminum chloride and iron are not available with this technique.

U.S. Pat. No. 6,899,822 teaches the use of an acidifying electrolyte such as sodium bisulfate in the presence of sodium chloride and iron. However, none of the examples teach depositing the materials onto the iron.

BRIEF SUMMARY OF THE INVENTION

This invention claims a process for manufacturing an oxygen scavenging particle wherein the particle comprises at least one oxidizable component and at least one activating component, and said process comprises contacting the oxidizable component with a gas containing a vapour of the activating component and depositing the activating component from the gas onto the oxidizable component in either a liquid or solid form.

The invention further discloses that the activating component may contain a halide, in particular a metal halide. Further disclosed is the use of a protic solvent hydrolysable halogen compound as the activating component. Specifically disclosed are $AlCl_3$, $FeCl_2$, $FeCl_3$, $TiCl_4$, $POCl_3$, $SnCl_4$, $SOCl_2$, n-Butyl $SnCl_3$, and $AlBr_3$ as protic solvent hydrolysable halogens.

Also disclosed is that the oxidizable component comprise an oxidizable metal or oxidizable metal alloy, preferably iron, aluminum, copper, zinc, manganese, magnesium and cobalt. It is further disclosed that prior to the deposition of the activating component onto the oxidizable component, the oxidizable component can be reduced from a higher oxidation state in a chamber selected from the group of the same chamber in which the oxidizable component is brought in contact with the activating component and a chamber connected to the chamber in which the oxidizable component is brought in contact with the activating component.

Further disclosed is a process for manufacturing an oxygen scavenging particle wherein the particle comprises at least one oxidizable component and at least one activating component, and said process comprises contacting the activating component with a gas containing a vapour of the oxidizable component and depositing the oxidizable component from the gas onto the activating component in either a liquid or solid form.

The product of this process can be incorporated into the wall of a container comprising a thermoplastic film-forming polymer in particular polyethylene terephthalate and copolymers of polyethylene terephthalate. Also disclosed is the wall of a container made from the film forming polymers such as a polyamide, polyethylene, or polypropylene wherein the particles are incorporated into the film forming polymer.

DETAILED DESCRIPTION OF THE INVENTION

Figure 1:
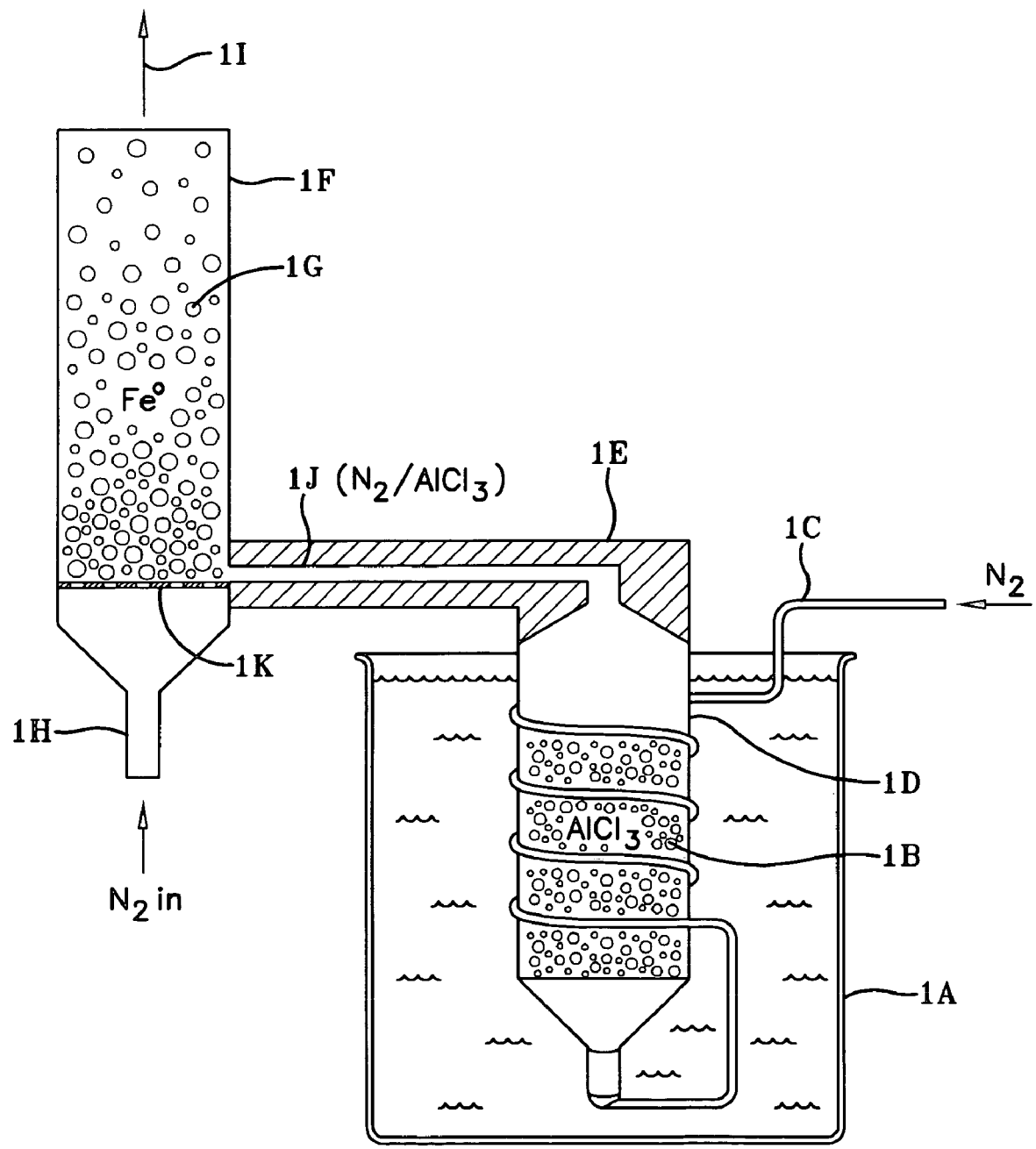
FIG. 1 depicts a typical vapour deposition apparatus whereby the one component is vaporized in one vessel called a vaporizer and then deposited upon the other component in another vessel called the deposition reactor.

The deficiencies in the prior art can be eliminated according to the invention by providing particles having high oxygen-scavenging efficiency in the presence of a protic solvent such as humidity or liquid phase water.

These particles comprise an oxidizable component, preferably an elemental metal such as of iron, cobalt, aluminum, copper, zinc, manganese, and magnesium, and at least one activating component; wherein one component has been deposited from the vapour phase onto the other component. Implicitly, then to have the most utility, both components should not boil or sublime at standard temperature and pressure.

It should be noted that while the examples deal with metals as oxidizable components, the invention is not limited to metals and electrolytes, but any system where the components meet the criteria outlined below. The oxidizable component could be an organic whereby the catalyst has be deposited from the vapour phase.

The role of the activating component is to promote or initiate the reaction of the oxidizable component with oxygen. In the absence of the activating component, there is little or no reaction of the oxidizable component with oxygen. The test therefore is whether the oxidizable component reacts with more oxygen in the presence of the activating component than when the activating component is absent. In the case of a triggerable system, such as requiring those requiring water, the rate of oxygen consumption of the composition comprising the activating component, the oxidizable component and water is compared with the rate of oxygen consumption of the oxidizable component and water.

For clarity, the activating component need not be the actual compound that participates in or catalyzes the reaction with oxygen, but may participate in a reaction which produces a compound which does participate in or catalyze the reaction with oxygen. While not to be bound by any mechanism, one hypothesis is that the aluminum chloride reacts with the water to form hydrochloric acid and it is the hydrochloric acid which actually sets up the galvanic cell. The other hypothesis is that the hydrochloric acid reacts to form iron chloride, which is a known activator of the reaction of oxygen with oxidizable metals.

It is therefore preferable that the activating component initiate the reaction of the oxidizable component in the presence of water. The phrase initiate the reaction of the oxidizable component means that when in the presence of water and the activating component, the oxidizable component becomes more reactive with oxygen than it would be in the presence of water without the activating component.

For a particle to be initiated by water contact, it is essential that this activating component promote or catalyze the reaction in the presence of moisture. This promotion can be with or without the production of intermediate compounds. The moisture can come from direct contact with the liquid, absorption from the surrounding air or vapour or migration through another material. Requiring water is what makes the composition triggerable. In a typical application, the water will come from the packaged goods, such as beer or juice. When the composition is bound in the walls of a container, the water from the packaged goods migrates to the particle initiating the reaction of the particle with oxygen that passes from the outside of the wall to the inside.

To be triggerable, the activating component should be a water soluble electrolyte, a water soluble acidifying electrolyte, a mixture of a water soluble electrolyte and acidifying agents, or a protic solvent hydrolysable compound or react to form an acidifying electrolyte, a mixture of a water soluble electrolyte and acidifying electrolyte. Of the protic solvent hydrolysable compounds, those with halogens such as chlorine and bromine are preferred. Again, the activating component is a component which increases the reaction rate of the oxidizable component with oxygen. Whether the activating component remains in the system is irrelevant.

The ability of the activating component to initiate the oxygen scavenging reaction depends upon the acidity and electrolytic strengths of the activating component or products of the activating component's hydrolyzation. For example, it is believed that when sufficient water contacts the $AlCl_3$/Iron particle, the $AlCl_3$ hydrolyzes to $Al_2O_3$ and hydrochloric acid. Hydrochloric acid is a strong acid and electrolyte which promotes the rapid and efficient reaction of the iron with oxygen.

U.S. Pat. No. 5,885,481, the teachings of which are incorporated by reference herein, teaches the advantages of using a non-halogenated acidifying electrolytic component.

Many protic solvent hydrolysable compounds such as titanium tetrachloride, tin tetrachloride, and $POCl_3$, $SOCl_2$, $SCl_2$, $S_2Cl_2$, $PCl_3$, $PSCl_3$, $PBr_3$, $POBr_3$, $PSBr_3$, $PCl_5$, $PBr_5$, $SiCl_4$, $GeC_4$, $SbCl_5$ are liquids at room temperature and readily boil. Other protic solvent hydrolysable compounds such as $AlCl_3$, $FeCl_2$, $FeCl_3$, $AlBr_3$, $SbCl_3$, $SbBr_3$, and $ZrCl_4$ sublime at relatively low temperatures. Higher boiling compounds are $ZnCl_2$, $ZnBr_2$ and $FeBr_3$.

Preferred protic solvent hydrolysable halogen compounds are the halides, in particular chloride and bromide, more preferably $AlCl_3$, $AlBr_3$, $FeCl_2$ $FeBr_2$, $TiCl_4$, $SnCl_4$, and $POCl_3$.

A non-triggerable system can also be made using the vapour deposition process described in this invention. If non-triggerable, the activating component promotes the reaction of the oxidizable component with oxygen immediately, or with very low amounts of moisture, (<70%, R.H.) upon contact with the oxidizable component. See, for example U.S. Pat. No. 6,133,361 noting metallic iodide and metallic bromide compounds are examples of activating components that require very little moisture and are therefore non-triggerable activating components. Those metallic iodide and metallic bromide compounds which can be placed into the vapour phase are therefore contemplated with the claims of this process.

The vapour deposition process requires two quasi-unit operations. The first unit operation, or step, is contacting the oxidizable component with the vapour phase of the activating component. The next unit operation, or second step, is the vapour deposition wherein the activating component is condensed or de-sublimed as a liquid or solid onto the oxidizable component. For clarity, this invention is not limited to vapour depositing the activating component onto the oxidizable component. The invention is equally applicable to depositing the oxidizable component onto the activating component if such were desired.

While the following examples teach and emphasize the vapour deposition of the activating component onto the oxidizable component, the oxidizable component could be deposited from the vapour stream onto the activating component. For example, iron penta-carbonyl, $Fe(CO)_5$, thermally decomposes into elemental iron. As it decomposes it moves from the vapour phase. If the thermal decomposition of carbonyl iron occurred over a bed of sodium chloride particles, the elemental iron would form around the sodium chloride particles. In the proper ratios, the water would dissolve the sodium chloride away leaving a hollow iron sphere to react with the oxygen.

Contacting the oxidizable component with the vapour phase activating component and condensing or de-subliming the activating component onto the oxidizable component are not distinct or separate process steps requiring intervention or a time interval between them. These unit operations can occur simultaneously. As described in the fourth embodiment, the vapour phase activating component will condense or de-sublime when it is brought in contact with a cooler oxidizable component. Therefore, the contacting step refers to the step of placing the vapour phase activating component in the same chamber as the oxidizable component so that the components are touching or in contact with each other. The vapour deposition step refers to the actual phase change that occurs when the vapour phase activating component goes from a gas to either a liquid or a solid. Some will say that when the hot vapour contacts the cold solid, the phase change is immediate. Thus, while the steps are listed sequentially, it is fully contemplated as demonstrated in the examples, that the steps could well occur virtually simultaneously.

In general, the activating component is placed into a vapour stream by either boiling, flashing or subliming the activating component by manipulating temperature and/or pressure. The vaporized activating component is contacted with the oxidizable particles and once in contact with the oxidizable particle, the activating component is deposited from the vapour stream onto the oxidizable component through condensation or de-sublimation.

The terms vapour deposition, deposited onto, deposited onto from a vapour stream, deposited from a vapour stream, or deposition of the component from a gas to either a liquid or solid on the oxidizable component all refer to the condensation, de-sublimation, or their equivalent, of the one component onto the other component; usually the deposition of the activating component onto the oxidizable component. By implication, even when the word vapour is not present, the deposition occurs from a vapour stream.

The deposition of the activating component on the oxidizable metal from a vapour stream intimately attaches the activating component with the oxidizable component and creates a discrete particle containing both components. These scavenging particles can then be mixed into a polymer matrix by any of the known techniques, such as dispersing the particles into polymer liquid via a liquid melt reactor, an extruder or even during the injection molding or extrusion of an article such as a preform, film or sheet.

The vapour deposition can be accomplished by contacting the gas phase activating component with the oxidizable component and condensing the activating component onto the oxidizable component. The best results are achieved when the process is conducted in view of the following observations.

The process is best carried out in an oxygen and moisture free environment. Also, because of the intimacy of contact, the required amount of activating component is substantially less than prior art indications. The desired ratio of activating component to oxidizable component can readily be determined by trial and error without undue experimentation. One makes particles according to the process, analyzes the results and increases or decreases the amount of activating component to achieve the desired oxygen scavenging activity. The scavenging function is not linear with the amount of activating component and at some point too much activating component can be used.

The oxidizable component could be several compounds, or alloys of compounds. Additionally, the activating component is also not limited to just one compound. Additional agents such as binders and water absorbers can be placed on the oxidizable particle first and the particle subjected to vapour deposition. For example, one could use a water slurry to put sodium chloride onto iron particles and then vapour deposit $AlCl_3$ onto the NaCl/$Fe^0$ particle. Many variations become apparent in light of the following embodiments.

In the first embodiment, the vapour deposition is carried out in a single chamber by placing the desired proportions of oxidizable component and activating component into a chamber or vessel. The chamber and its contents are then heated to a sufficient temperature and/or exposed to sufficient vacuum to place the activating component into the vapour phase. In the case of aluminum chloride, the activating component sublimes into the vapour phase. In the case of titanium tetrachloride, the activating component boils into the vapour phase. Pressure must be reduced for those compounds which decompose at high temperatures.

The vapour deposition (condensation or de-sublimation) of the vapour phase activating component onto the oxidizable component can be accomplished by cooling and/or increasing the pressure so that the activating component will transition from a vapour to either a liquid or solid on the oxidizable component. The resulting oxygen scavenger particles can then be incorporated into a polymer matrix which is then subsequently formed into a container wall.

In a second embodiment, vapour deposition can be carried out by placing the activating component into its gaseous state or vapour phase by heating and/or reducing the pressure surrounding the activating component. The stream of vapour phase activating component is then placed in contact with the oxidizable particles. The activating component can then be deposited from the vapour stream onto the oxidizable particles by cooling and/or increasing the pressure of the system.

In a third embodiment, the stream of vapour phase activating component is placed in contact with a bed of oxidizable particles. It is advantageous to fluidize the bed and use the stream of gaseous vapour phase activating component as the fluidizing media. Depending upon the amount of activating component, the vapour stream may need to be supplemented with an inert gas such as nitrogen to maintain fluidized nature of the bed.

FIG. 1 depicts the vapour deposition apparatus also used in Examples IV, Vb, Vc, and Vd. The vaporizer or sublimator, depicted by the label 1D, operates as a sublimator of $AlCl_3$, depicted as 1B. The vaporizer or sublimator, 1D, is attached to the deposition reactor, depicted by the label 1F. In FIG. 1, nitrogen ($N_2$) is introduced into the vaporizer/sublimator (1D), through the tube labelled 1C. The nitrogen is heated to the desired sublimation temperature as it passes through the heating media, preferably a sand bath, depicted by 1A.

In the case of $AlCl_3$, this temperature is approximately 235-250° C. For materials which boil instead of sublime, the temperature would be at or above the respective boiling point. The pre-heated nitrogen passes through the $AlCl_3$ bed labelled 1B, fluidizing the $AlCl_3$ and carrying the nitrogen/$AlCl_3$ vapours through the heated tube labelled 1J. The heating coils and insulation of tube 1J are depicted as 1E. The nitrogen/$AlCl_3$ vapour is introduced into the deposition reactor labelled 1F at the base of the fluidized iron bed depicted as 1G, but above the distribution plate identified as 1K. The iron is fluidized by the fluidizing nitrogen introduced into the deposition reactor labelled 1F through inlet tube 1H. The nitrogen flows through holes in the distributor plate 1K. The temperature of the iron particles is substantially below the de-sublimation or condensation temperature of the $AlCl_3$. The cooling from the iron particles causes the $AlCl_3$ to condense or de-sublime from the vapour stream onto the fluidized iron particles. The nitrogen then exits the deposition reactor at 1I. After the $AlCl_3$ is consumed and deposited on the iron, the iron is removed from the deposition reactor 1F.

The deposition of aluminum chloride on an oxidizable particle, such as elemental iron, is best carried out at as fast a rate as possible in order to minimize the growth of large crystals of aluminum chloride resulting in a more uniform coating of the particles. For the aluminum chloride/iron system, the sublimator should be operated at a temperature between 225 and 250° C., preferably at 235-240° C. and the nitrogen used to sweep the aluminum chloride vapours out of the sublimator should be preheated to about this same temperature. Surprisingly, the aluminum chloride sublimation at a nitrogen linear velocity of 30 ft/min thru a 2 inch diameter sublimator, at 250° C. was slower than the sublimation at 235° C. This is believed to be a result of the aluminum chloride clumping and reducing the effective surface area from which sublimation can occur. The sublimation can be followed by measuring the temperature of the sublimator at various points along its height. As sublimation of the aluminum chloride progresses, the temperature measured by a probe in the reactor near the top approaches that of the heating bath. With additional sublimation time, a probe near the midpoint will approach this temperature and eventually, a probe near the base also reaches the heating bath temperature. At the same time, the temperature of the metal bed where the aluminum chloride is being condensed will reach a maximum temperature and then, as there is less and less aluminum chloride to sublime and recondense, approach room temperature.

Transfer lines to the vapour deposition reactor should be traced to prevent the vaporized component from condensing in the line. In the case of aluminum chloride, the line temperature should be maintained at least at 200° C., preferably at about 220° C. to avoid condensation of the aluminum chloride in the lines.

The velocity of nitrogen thru the fluidization reactor is dependent upon the shape and size of the oxidizable particles powder and also the reactor design. This must be determined experimentally. An agitator was also fitted to the reactor to provide the most efficient mixing of the oxidizable particles and consequently optimize the uniformity of the vapour deposition.

Operation of a bed of particles is well known in the art and such bed may be fluidized, fixed, horizontal, or vertical. The bed may be moving, as in a continuous operation or static, wherein the vapour is recirculated through the bed until the desired amount of activating component is deposited upon the oxidizable component.

The deposition can comprise its own set of variations. In the preferred fourth embodiment the stream of vaporized activating component(s) is brought in contact with a bed of cooler oxidizable particles. The temperatures of the activating component(s) and oxidizable component(s) are selected such that once the vapour stream contacts the oxidizable component, the activating component(s) is immediately deposited from the vapour stream onto the colder oxidizable component(s). An alternative variation is to pass the cooler oxidizable component(s) through the chamber containing the vaporized activating component(s).

One skilled in the art will recognize that a simple enthalpy balance will determine the maximum allowable temperature of the solid oxidizable component.

The temperature chosen must be below the respective vaporization temperature of the activating component at the deposition pressure, usually atmospheric. The following example demonstrates the math as applied to an oxidizable metal. The initial temperature must therefore be less than the vaporization temperature at the deposition pressure minus the amount of activating component times the heat of vaporization of the activating component divided by the product of the amount of oxidizable metal times the heat capacity of the solid metal.

$$[(Tv-Ts) \times Cp_{ACg} + Hv)] \times AC \leq (Tf-Ti) \times (OC \times Cp_{OCs})$$

Where,

Tv=Temperature of the Activating Component in its Initial Vapor Phase

Ts=Temperature at which the Activating Component Desublimes or Condenses.

$Cp_{OCs}$=Heat Capacity of the Oxidizable Component at Deposition Conditions.

Hv=Heat of DeSublimation or Condensation of the Activating Component at Deposition Temperature and Pressure AC=Amount of Activating Component Ti=Initial Temperature of the Oxidizable Component.

Tf=Final Temperature of the Oxidizable Component.

OC=Amount of Oxidizable Component $Cp_{OCs}$=Heat Capacity of the Oxidizable Component at Deposition Conditions.

The maximum initial temperature will occur if the oxidizable component final temperature reaches the deposition temperature (sublimation or boiling point). Therefore, Ts can be substituted for Tf and the balance can be solved for the maximum Ti. Ti can therefore must be less than the value in the following equation.

$$Ti \leq Ts - [((Tv-Ts) \times Cp_{ACg} + Hv)) \times AC/(OC \times Cp_{OCs})]$$

In practice, one will want to keep the initial temperature well below the vaporisation temperature.

After dispersion of the vapour deposited oxygen scavenging particle into the polymer matrix, every polymer void or capsule containing a particle with the oxidizable component will also contain an activating component. In contrast, when a dry blend of the activating and oxidizable components is incorporated into the polymer matrix the separate particles are often not in the same vicinity and the polymer separating the activating component from the oxidizable component creates a barrier that renders the particle virtually ineffective as an oxygen scavenger.

The oxidizable particles preferably have an average particle size less than 50 μm. Iron is the preferred metal based upon cost. While the electrolytic reduced unannealed or annealed iron is preferred, carbonyl and carbon monoxide or hydrogen reduced sponge irons are also suitable. It should be noted that hydrogen and carbon monoxide reduced forms, known as sponge iron, are generally less reactive than the electrolytic reduced iron.

While iron is the preferred oxidizable component for cost reasons, cobalt, tin, aluminum, zinc, manganese and copper are all candidates for the process of this invention.

It is also possible to reduce the oxidizable component immediately prior to the vapour deposition, thus creating an efficient batch or continuous production process starting from inexpensive oxidized raw materials. For example, the reduction of iron oxide to elemental iron is well known in the art and can be done by passing hot hydrogen or carbon monoxide over the metal. The hydrogen or carbon monoxide reacts with the oxygen leaving the reduced porous metal behind. In a batch process, the reduction would occur in the same chamber as the deposition. In a continuous process, the reduction would occur in a separate chamber and the reduced metal passed to a different chamber where the activating component would be deposited onto oxidizable metal.

Vapour deposition as used in this invention is also very effective when creating nano-scale oxygen scavenging particles when compared to the conventional blending or slurry contacting techniques. Nano-size iron particles are those particles with diameters less than 1 micron, preferably less than 500 nanometers, and more preferably less than 200 nanometers.

The intimate contact of the activating component is essential for nano-scale particles in a fixed media such as a film or container wall. Dry blends of traditional scavenging compositions do not provide enough activating component in intimate contact with the nano-iron to be effective in a fixed media.

The addition of the reduction step prior to vapour deposition is particularly useful in treating nano-iron. Due to its pyrophoricity, nano-iron is often treated with organic oils or solvents so it can be safely shipped and handled. These solvents often reduce the reactivity of the nano-iron. However, fully oxidized iron (nano-rust) is readily available in nano-scale and is used for pigments and paints.

This nano-rust can be placed into a reduction chamber and reduced to nano-iron. The nano-iron can then be transported to vapour deposition chamber where the vaporized activating component is then deposited from the vapour stream onto the nano-iron. In this fashion, the nano-oxygen scavenger can be made in a batch or continuous process starting from nano-rust.

In another embodiment, the nano-rust can be reduced in the same chamber as the vapour deposition.

The oxidizable component, particularly the metals, does not need to be 100% pure. Minor alloying elements such as nickel, chromium, silicon and other compounds can be present. Using iron as an example, the mixtures of iron with minor amounts of other metals can be used. The iron-based compositions are incorporated into the wall of a container made from film-forming polymers, preferably aromatic polyester, in amounts from 500 to 10000 parts by weight per million parts by weight polymer, preferably 1000 to 6000 parts per million parts polymer. In the case of nano-scale scavengers, 200-2000 ppm may be sufficient. When used in non-transparent packaging, the amounts of scavenging composition can go as high as 5 weight percent of the total polymer—iron composition.

Of the film forming polymers, polyester is preferred. Suitable polyesters include those produced from aromatic, aliphatic or cycloaliphatic dicarboxylic acids of from 4 to about 40 carbon atoms and aliphatic or alicyclic glycols having from 2 to about 24 carbon atoms.

Polyesters employed in the present invention can be prepared by conventional polymerization procedures well known in the art. The polyester polymers and copolymers may be prepared, for example, by melt phase polymerization involving the reaction of a diol with a dicarboxylic acid, or its corresponding diester. Various copolymers resulting from use of multiple diols and diacids may also be used. Polymers containing repeating units of only one chemical composition are homopolymers. Polymers with two or more chemically different repeat units in the same macromolecule are termed copolymers. The diversity of the repeat units depends on the number of different types of monomers present in the initial polymerization reaction. In the case of polyesters, copolymers include reacting one or more diols with a diacid or multiple diacids, and are sometimes referred to as terpolymers.

As noted hereinabove, suitable dicarboxylic acids include those comprising from about 4 to about 40 carbon atoms. Specific dicarboxylic acids include, but are not limited to, terephthalic acid, isophthalic acid, naphthalene 2,6-dicarboxylic acid, cyclohexanedicarboxylic acid, cyclohexanediacetic acid, diphenyl-4,4'-dicarboxylic acid, 1,3-phenylenedioxydiacetic acid, 1,2-phenylenedioxydiacetic acid, 1,4-phenylenedioxydiacetic acid, succinic acid, glutaric acid, adipic acid, azelaic acid, sebacic acid, and the like. Specific esters include, but are not limited to, the various isomeric phthalic and naphthalic diesters.

These acids or esters may be reacted with an aliphatic diol preferably having from about 2 to about 24 carbon atoms, a cycloaliphatic diol having from about 7 to about 24 carbon atoms, an aromatic diol having from about 6 to about 24 carbon atoms, or a glycol ether having from 4 to 24 carbon atoms. Suitable diols include, but are not limited to ethylene glycol, 1,4-butenediol, trimethylene glycol, 1,6-hexanediol, 1,4-cyclohexanedimethanol, diethylene glycol, resorcinol ethoxy ethyl ether, and hydroquinone ethoxy ethyl ether.

Polyfunctional comonomers can also be used, typically in amounts of from about 0.1 to about 3 mole percent. Suitable comonomers include, but are not limited to, trimellitic anhydride, trimethylolpropane, pyromellitic dianhydride (PMDA), and pentaerythritol. Polyester-forming polyacids or polyols can also be used. Blends of polyesters and copolyesters may also be useful in the present invention.

One preferred polyester is polyethylene terephthalate (PET) formed from the approximate 1:1 stoichiometric reaction of terephthalic acid, or its ester, with ethylene glycol. Another preferred polyester is polyethylene naphthalate (PEN) formed from the approximate 1:1 to 1:1.6 stoichiometric reaction of naphthalene dicarboxylic acid, or its ester, with ethylene glycol. Another preferred polyester is polybutylene terephthalate (PBT). Copolymers of PET, copolymers of PEN, and copolymers of PBT are also preferred. Specific copolymers and terpolymers of interest are PET with combinations of isophthalic acid or its diester, 2,6 naphthalic acid or its diester, and/or cyclohexane dimethanol.

The esterification or polycondensation reaction of the carboxylic acid or ester with glycol typically takes place in the presence of a catalyst. Suitable catalysts include, but are not limited to, antimony oxide, antimony triacetate, antimony ethylene glycolate, organomagnesium, tin oxide, titanium alkoxides, dibutyl tin dilaurate, and germanium oxide. These catalysts may be used in combination with zinc, manganese, or magnesium acetates or benzoates. Catalysts comprising antimony are preferred. Another preferred polyester is polytrimethylene terephthalate (PTT). It can be prepared by, for example, reacting 1,3-propanediol with at least one aromatic diacid or alkyl ester thereof. Preferred diacids and alkyl esters include terephthalic acid (TPA) or dimethyl terephthalate (DMT). Accordingly, the PTT preferably comprises at least about 80 mole percent of either TPA or DMT. Other diols which may be copolymerized in such a polyester include, for example, ethylene glycol, diethylene glycol, 1,4-cyclohexane dimethanol, and 1,4-butanediol. Isophthalic acid and sebacic acid are an example of simultaneously using an aromatic and aliphatic acid to make a copolymer.

Preferred catalysts for preparing PTT include titanium and zirconium compounds. Suitable catalytic titanium compounds include, but are not limited to, titanium alkylates and their derivatives, titanium complex salts, titanium complexes with hydroxycarboxylic acids, titanium dioxide-silicon dioxide-co-precipitates, and hydrated alkaline-containing titanium dioxide. Specific examples include tetra-(2-ethylhexyl)-titanate, tetrastearyl titanate, diisopropoxy-bis(acetylacetonato)-titanium, di-n-butoxy-bis(triethanolaminato)-titanium, tributylmonoacetyltitanate, triisopropyl monoacetyltitanate, tetrabenzoic acid titanate, alkali titanium oxalates and malonates, potassium hexafluorotitanate, and titanium complexes with tartaric acid, citric acid or lactic acid. Preferred catalytic titanium compounds are titanium tetrabutylate and titanium tetraisopropylate. The corresponding zirconium compounds may also be used.

The polymer using this invention may also contain small amounts of phosphorous compounds, such as phosphates, and a catalyst such as a cobalt compound, that tends to impart a blue hue. Also, small amounts of other polymers such as polyolefins can be tolerated in the continuous matrix.

The melt phase polymerization described above may be followed by a crystallization step, then a solid phase polymerization (SSP) step to achieve the intrinsic viscosity necessary for the manufacture of certain articles such as bottles. The crystallization and polymerization can be performed in a tumbler dryer reaction in a batch-type system.

In many cases, it is advantageous to incorporate the scavenger immediately following the melt polymerization step and subjecting the polymer containing the scavenger to the solid phase polymerization. The vapour deposition process of this invention creates particles which do not substantially degrade or colour the polymer during the solid phase polymerization. In contrast, the product from the organic liquid deposition process does cause discoloration. This is believed to come from the tramp organic or adducts which are attached to the particle.

Alternatively, the crystallization and polymerization can be accomplished in a continuous solid state process whereby the polymer flows from one vessel to another after its predetermined treatment in each vessel. The crystallization conditions preferably include a temperature of from about 100° C. to about 150° C. The solid phase polymerization conditions preferably include a temperature of from about 200° C. to about 232° C., and more preferably from about 215° C. to about 232° C. The solid phase polymerization may be carried out for a time sufficient to raise the intrinsic viscosity to the desired level, which will depend upon the application. For a typical bottle application, the preferred intrinsic viscosity is from about 0.65 to about 1.0 deciliter/gram, as determined by ASTM D-4603-86 at 30° C. in a 60/40 by weight mixture of phenol and tetrachloroethane. The time required to reach this viscosity may range from about 8 to about 21 hours.

However, one could use a film forming polyester of at least 0.45 dl/g, an intermediate feed I.V. of 0.49 to 0.59 dl/g, or more preferably 0.52 to 0.56 dl/g. The polymer could also be a polyester bottle resin of feed I.V. ranging from 0.59 to 0.69 dl/g, more preferably 0.61 to 0.64 dl/g, with a typical I.V. for bottles ranging from 0.72 to 0.84 dl/g, more preferably 0.74 to 0.82 dl/g. For packaging trays the typical I.V. ranges from 0.80 to 1.50 dl/g, more preferably from 0.89 to 0.95 dl/g. It is noted that while the measured I.V. of a polymer is a single value, that value represents the composite of the various molecule chain lengths.

In one embodiment of the invention, the article-forming polyester of the present invention may comprise recycled polyester or materials derived from recycled polyester, such as polyester monomers, catalysts, and oligomers. Examples of other film-forming polymers include polyamides, polycarbonate, PVC and polyolefins such as polyethylene and polypropylene.

The oxygen-scavenging compositions can be added directly to the thermoplastic polymer compounding or melt-fabrication operation, such as the extrusion section thereof, after which the molten mixture can be advanced directly to the article-fabrication line.

Alternatively, the compositions can be compounded into masterbatch concentrate pellets, which can be further incorporated into packaging polymers for further processing into the desired article.

The concentrates in polyester resins preferably contain more than 20 parts of oxygen-scavenging composition per hundred parts of resin, but preferably between 5 and 10 parts per hundred. Containers having at least one wall incorporating the oxygen-scavengers of the present invention are the preferred articles. Cups, pouches, boxes, bottles, lids and wrapped films are also examples of such walls. Stretched and unstretched films are included in the definition of container walls.

It is also contemplated to provide articles, with both active and passive oxygen barrier properties through use of one or more passive gas barrier layers in conjunction with one or more layers according to the invention. Alternatively, the passive barrier and oxygen scavenging composition may both be in the same layer.

Thus for products calling for long shelf-life, an oxygen scavenging layer according the present invention can be used in conjunction with a passive gas barrier layer.

Another advantage of the claimed particles and of the polymers and manufactured articles into which they are incorporated is their storage stability i.e. their lack of reactivity in the absence of humidity, which permits long storage periods before filling.

As mentioned, the containers having at least a light transmitting wall comprising the oxygen-scavenging compositions of the present invention, advantageously possess both high scavenging efficiency and the unique property of the reduced bloom of the particle upon reacting with oxygen in presence of humidity. The reduced bloom size also occurs in containers having haze values falling within a commercially acceptable range.

Many polymers are transparent, but polymers that are transparent to visible light may become opaque, as the result of the presence of additives such as fillers, scavengers, stabilizers, and similar additives. The opacity results from light-scattering occurring within the material.

Haze is the measure of the amount of light deviation from the direction of transmittance by at least 2.5 degrees.

The colour and brightness of a polyester article can be observed visually, and can also be quantitatively determined by a HunterLab Color Quest Spectrometer. This instrument uses the 1976 CIE, a*, b* and L* designation of colour and brightness. An a* coordinate defines a colour axis wherein plus values are toward the red end of the colour spectrum and minus values are toward the green end.

The b* coordinate defines a second colour axis, wherein plus values are toward the yellow end and minus values are toward the blue end.

Higher L* values indicate enhanced brightness of the material.

As indicated, the containers comprising at least one wall incorporating the oxygen scavengers of the present invention do not present as large a bloom as do conventional scavengers upon aging.

The microscope observation of the wall upon aging shows a limited number of black dots uniformly distributed within the wall; the wall area occupied by the dots is a small fraction of the total area. By contrast, the wall of the containers incorporating prior art oxygen-scavengers show marked visual dots due to the formation of large blooms distributed along the wall. Conventional scavengers also show a yellow/orange coloration. The compositions listed in the examples showed a darkening of the container wall, but no yellow/orange shift in colour.

The colour parameters of the wall of the containers of the present invention show a small decrease of the minus a* values and plus b* values referred to the a* and b* values of the wall not containing scavengers, whereas the walls incorporating prior art scavengers show plus a* values and increased plus b* values.

Preferred wall-containers are stretched bottles with a thickness from about 280 to 410 μm and haze values of about 1% or less per mil thickness. Note that all bottle sidewalls used in the examples fall within the thickness noted.

The following examples are provided for purpose of illustrating the manufacture of the composition and the composition properties and are not intended to limit the scope of the invention.

While the best mode and preferred embodiment of the invention have been set forth in accord with the Patent Statutes, the scope of this invention is not limited thereto, but rather is defined by the attached claims. Thus, the scope of the invention includes all modifications and variations that may fall within the scope of the claims Standard Evaluation Procedure Each series of scavenging particles was evaluated for oxygen scavenging and bottle aesthetics as follows:

Unless otherwise indicated, the scavenging particles were dispersed into the polymer matrix of either 52 or 27 gram preforms by mixing 6 gms of the oxygen scavenging particles with 1994 gms of a commercially available PET co-polyester (8006S supplied by M&G Polymers USA, LLC) which had been previously dried overnight in a vacuum oven at 150° C. in a can. The physical mixture was then charged to an injection molding machine which melted the polymer and dispersed the particles into the preforms. The preforms were blown into either 2 Liter or 600 ml, bottles, respectively, after they had aged for one day. In the case of the nano-scale scavenging particles, 1000 ppm of the scavenging particles were added to the polymer.

Panels were cut from the walls of the bottles and analyzed for oxygen scavenging capability using the accelerated oxygen scavenging test method described in the methods section. The oxygen data is listed in Table I and demonstrates the high degree of scavenging and the triggerable nature of the scavenger. Table II lists the bottle aesthetics of haze, L*, a*, and b*.

EXAMPLE I $Fe^0$/10% $FeCl_3$ in Sealed Vessel

A 50 ml Erlenmeyer flask with a screw cap was dried at 150° C. under nitrogen (nitrogen) and cooled to room temperature. The flask was then charged with the activating component (5.42 gms or 0.033 moles of anhydrous $FeCl_3$ obtained from Aldrich Chemical Company) and 55.8 gms (1.0 moles) of oxidizable component (reduced sponge iron powder from North American Hoganas, grade XCS 50). The $FeCl_3$ (boiling point of 316° C., vaporization temperature of 300° C.) was converted to a gas and brought in contact with reduced iron by placing the capped flask in a 300° C. fluidized sand bath overnight. The $FeCl_3$ was deposited onto the iron by cooling the flask under nitrogen. The resulting particles were broken up and crushed into finer particles. The oxygen scavenging particles contained 3.28 weight percent chloride.

The oxygen scavenging analysis showed that there was little reactivity under dry conditions, but a high degree of reactivity when wet. This indicated the system was highly reactive and also triggerable.

EXAMPLE II $Fe^0$/$FeCl_3$ in a Fluidized Bed

A tubular fluidized bed deposition reactor was charged with 5.45 Kgs of −38/+20 micron sized electrolytically reduced iron metal powder (grade EA-230, available from OMG, now North American Hoganas). The −38/+20 sieve cut was obtained by screening the powder through 38 micron and 20 micron Tyler screens and recovering the part on top of the 20 micron screen. The iron powder bed was fluidized by passing a sufficient rate of nitrogen through a nitrogen distributor plate and through the bed.

The $FeCl_3$ (Aldrich, USA) was vaporized into the gas phase in a second reaction vessel called a vaporizer or sublimator. 26 gms of $FeCl_3$ (nominally 0.5 w/w % $FeCl_3$) was placed in the vaporizer which was enclosed in a 300° C. sand bath. The $FeCl_3$ was conveyed to the fluidized bed by passing nitrogen over the top of the $FeCl_3$, taking the nitrogen containing the $FeCl_3$ vapours from the top of the reactor and piping it through a traced, insulated transfer line to the tubular fluidized bed reactor containing the fluidized iron metal powder. The vaporized $FeCl_3$ was contacted with the iron by introducing the $FeCl_3$ just above the nitrogen distributor plate of the tubular reactor.

After the $FeCl_3$ in the vaporizer reached 300° C., the temperature of the sand bath was increased to 340° C. over 1 hr. Over the next two hours the vaporizer was held at 340° C. during which time the temperature of the iron increased to 56° C. This increased iron temperature indicates deposition of $FeCl_3$ on the colder iron due to the latent heat of vaporization released during the phase change from vapour to solid. After two hours, the heat and nitrogen to the vaporizer were shut off, the fluidized iron then cooled to below 45° C. and discharged. On opening the vaporizer, 1 gm of an orange-red solid (presumably $Fe_2O_3$) remained.

Again, the reactivity is quite high, particularly considering there was only 0.5 w/w % $FeCl_3$ versus Example I which had nominally 10 w/w % $FeCl_3$ on the iron.

EXAMPLE III

Fe⁰/AlCl₃ in a Sealed Vessel

A 50 ml Erlenmeyer flask with a screw cap was dried at 150° C. and cooled to room temperature. 2.5 gms (0.019 mol) of anhydrous $AlCl_3$ (Aldrich, sublimation temperature 178° C.) and 100 gms (1.8 mol) reduced −20 micron iron powder were placed into the flask. The −20 micron powder was obtained by sieving grade EA-230 electrolytically reduced iron metal powder (available from OMG, now North American Hoganas). The flask containing the $AlCl_3$ and iron was capped and shaken to mix the ingredients. The $AlCl_3$ was vaporized and brought in contact with the iron by placing the flask in a fluidized sand bath at 175° C. for 3 hrs, removing the flask every 30-60 minutes to break up the loosely agglomerated mass. The $AlCl_3$ was deposited onto the iron by cooling the flask to room temperature under nitrogen. The resulting particles were broken up and crushed. Analysis showed 2.02% total chloride on the particles.

In this evaluation 4 gms of particles were dispersed into 1996 gms copolyester and the resulting bottle was a heat set panelled bottle. Bottles were also compounded with 2000 ppm of the particles and 5% MXD6 6001 Nylon from Mitsubishi Gas Chemical. No accelerated oxygen test was run on these bottles.

EXAMPLE IV

Fe⁰/5% AlCl₃ in a Fluidized Bed

The tubular fluidized bed reactor of Example II was charged with 5.45 Kgs of EA-230 electrolytic iron powder (available from OMG, now North American Hoganas, USA) sieved to −20 micron. The vaporizer of Example II contained 272.6 gms $AlCl_3$ (Aldrich, USA) and was placed in a sand bath at 225° C. Unlike Example II, hot nitrogen was passed through the $AlCl_3$ gas, taken out the top of the vaporizer and piped thru a traced, insulated transfer line to the tubular fluidized bed reactor containing the fluidized iron. The gaseous stream of $AlCl_3$ was brought in contact with the iron by introducing the gas into the tubular reactor just above the nitrogen distributor plate. The process was carried out for 15 minutes past the time at which the temperature immediately above the distributor plate in the vaporizer reached that of the top of the vaporizer. The deposition of the $AlCl_3$ on the iron was evident as the temperature of the iron increased to 57° C. The heat and nitrogen to the vaporizer were then turned off and the materials in the fluidized bed began to cool. When the iron cooled to below 45° C. it was discharged. On opening the vaporizer, essentially no $AlCl_3$ remained. Further, no evidence of $AlCl_3$ was observed on the upper part of the iron containing reactor.

EXAMPLE Va

"230 nm" Nano-Fe⁰/2% AlCl₃ in a Fluidized Bed

The reduction of the nano-iron was accomplished by placing 3.1 Kg of ferric oxide (R 1299, measuring 230 nanometer diameter prior to reduction, available from Elementis Pigments, East Saint Louis, Ill., USA) into a the tubular fluidized bed reactor of Example II. The reactor was placed in a sand bath and heated while nitrogen was passed into the base of the reactor at a rate sufficient to fluidize the bed. When the reactor reached a temperature of 450° C., the gas flow was switched from nitrogen to hydrogen. Hydrogen was passed through the reactor for 1 hr, holding the temperature at about 500-510° C. The hydrogen was then replaced with nitrogen, and the reactor removed from the sand bath and allowed to cool unopened overnight.

43 gms of $AlCl_3$ (Aldrich) was placed into the vaporizer of Example II and in a sand bath at 225° C. Hot nitrogen was passed over the top of the $AlCl_3$, taken back out the top of the reactor, piped through a traced, insulated transfer line to the tubular reactor containing the fluidized reduced nano-iron. The $AlCl_3$ was brought in contact with the iron by introducing the $AlCl_3$ into the tubular reactor at a point just above the nitrogen distributor plate. The iron temperature increased indicating the deposition of the $AlCl_3$. The process continued for 30 minutes after the temperatures in the vaporizer reached that of the sand bath. Heat and nitrogen to the vaporizer was then shut off and the iron cooled to below 45° C. The product was coated with about 500 ml mineral oil and discharged. On opening the vaporizer, 11 gm of $AlCl_3$ remained.

EXAMPLE Vb

"10×100 nm" Nano-Fe⁰/10% AlCl₃ in a Fluidized Bed 1.95 Kg of ferric oxide (AC-1022 from Johnson Matthey, Jacksonville Fla., USA) was reduced in the same manner as Example Va. Aluminum chloride ($AlCl_3$) (Aldrich, 136 g) was vaporized by passing hot nitrogen thru the bed of $AlCl_3$ which was contained in a tubular reactor immersed in a sand bath at 225° C. The nitrogen containing $AlCl_3$ was then taken out the top of the reactor and brought in contact with the iron by introducing the $AlCl_3$ into the iron containing tubular reactor at a point just above the nitrogen distributor plate. The iron temperature increased indicating the deposition of the $AlCl_3$. The process continued for 30 minutes after the temperatures in the vaporizer reached that of the sand bath. Heat and nitrogen to the vaporizer was then shut off and the iron cooled to below 45° C. The product was pyrophoric so two 8 oz jars were filled with dry powder under nitrogen and sealed. Degassed mineral spirits (1.5L) was added and the resulting slurry discharged. Essentially no $AlCl_3$ was observed in the vaporizer.

EXAMPLE Vc

"10×100 nm" Nano-Fe⁰/20% AlCl₃ in a Fluidized Bed

The process of Example Vb was repeated using 272 g $AlCl_3$. The product did not test as being pyrophoric but was treated as Example Vb as a precaution.

EXAMPLE Vd

"80 nm" Nano-Fe⁰/10% AlCl₃ in a Fluidized Bed

Ferric Oxide (ColorTherm Red 110M from Bayer), 1.96 kg was reduced in the manner outlined in Example Va.

AlCl3 (Aldrich), 136 g was then vapour deposited on the reduced ColorTherm Red 110M in the same manner as described in Vb.

EXAMPLE VIa

Blended Fe⁰/AlCl₃ Comparison

Under a nitrogen atmosphere, aluminium chloride powder was added directly to electrolytic iron powder at 2.5% and 10% weight based on the weight of iron and blended for two hours at room temperature on a roller mill. These are labelled VIa and VIb, respectively. 2 Liter bottles were made and sidewalls properties measured. The Hunter haze for the 10% blend at 3000 ppm iron was 53% and well above any commercially acceptable criteria for a transparent bottle.

EXAMPLE VIc

Comparison

A dry blend of 3000 ppm weight iron of Freshblend™ Scavenger from Multisorb Technologies, Buffalo, N.Y. USA was injection molded with PET into a 52.5 gram preform and made into a bottle (See "Multiple Functionality Sorbents", Calvo, William D. Proceedings of ACTIVEPack Conference, p 9 (2003) (announcing the commercialisation of Freshblend™ for polyester). The sidewall was subjected to the accelerated oxygen absorbance test (0.11 cm³ $O_2$/g polymer/ 1000 ppm Fe). While the compositions had comparable oxygen scavenger absorbance, size of the blooms is significantly smaller for Example I, the subject of the current invention.

EXAMPLES VId and VIe

Other Blend Comparisons

Compositions were made blending iron and NaCl (8 w/w % weight based on weight of iron) and blending iron and NaHSO₄ (10 w/w % based on weight of iron as described in U.S. Pat. No. 5,885,481). These blends were prepared by adding the appropriate salt directly into the iron powder and then mechanically blending of the mixture in a rotary mill. These two compositions are labelled VId and VIe respectively and were converted into 2 Liter bottles containing 4000 ppm of either blend.

EXAMPLES VII

Suitability for Solid State Polymerization

This series demonstrates the improvement of the vapour deposition over the deposition from an organic solution. The vapour deposited material (VIIa vs VIIb) does not exhibit the colour shift exhibited by the organic deposited scavenger (VIc vs VId), in particular after heat treatment such as solid phase polymerization. VIIa and VIb were blown into 0.51 bottles, while VIIc and VIId were blown into 2 Liter Bottles. Thus the comparison is the change in colour within the same bottle.

Example VIIa is the bottle from Example IV. It is carried here separately for clarity of comparison.

In Example VIIb, 3000 ppm of the iron of Example IV was compounded via twin screw extruder into the feed resin (nominal Intrinsic Viscosity of 0.49) of Cleartuf® 8006S Available from M&G Polymers, USA. The feed resin was then crystallized and polymerized in its solid phase under vacuum until the IV reached 0.84. The material was then blown into bottles using the procedures described earlier.

In Example VIc, bottles were made using 3000 ppm of scavenger prepared by depositing the AlCl₃ from an organic solution on iron as taught in Example 1 of European Patent Application 03425549.7 titled Oxygen Scavenging Compositions and the Application thereof in Packaging Containers filed Aug. 14, 2003, incorporated by reference.

In Example VId, 3000 ppm of scavenger from Example VIc was compounded into polyester, solid phase polymerized, and made into bottles similar to Example VIIb.

TABLE I

Oxygen Scavenging Performance

| Ex. | Description | Days of ageing in G.C. vial | Dry Reactivity (ccO2 per gram polymer) | Wet Reactivity (ccO2 per gram polymer) | Wet Reactivity (ccO2 per gram polymer per 1000 ppm Scavenging composition) |
|---|---|---|---|---|---|
| I | Fe⁰/FeCl₃ in sealed vessel | 1 | | 0.028 | 0.009 |
| | | 4 | | 0.102 | 0.034 |
| II | Fe⁰/0.5% FeCl₃ in a fluidized bed, 3000 ppm in PET | 1 | | 0.02 | 0.007 |
| | | 3 | | 0.05 | 0.017 |
| | | 10 | | 0.08 | 0.027 |
| IV | Fe⁰/5% AlCl₃ in a fluidized bed | 1 | 0.004 | 0.06 | 0.02 |
| | | 4 | 0.016 | 0.18 | 0.06 |
| | | 10 | 0.020 | 0.28 | 0.093 |
| Va | "230 nm" Nano-Fe⁰/2.0% AlCl₃ in a fluidized bed | 1 | 0.005 | 0.02 | 0.02 |
| | | 3 | 0.007 | 0.02 | 0.02 |
| | | 10 | 0.014 | 0.04 | 0.04 |
| Vb | "10 × 100 nm" Nano-Fe⁰/10% AlCl₃ in a fluidized bed, 1000ppm | 1 | 0.016 | 0.037 | 0.037 |
| | | 3 | 0.021 | 0.054 | 0.054 |
| | | 5 | 0.016 | 0.065 | 0.065 |
| Vc | "10 × 100 nm" Nano-Fe⁰/20% AlCl₃ in a fluidized bed, 1000 ppm | 1 | 0.008 | 0.030 | 0.030 |
| | | 3 | 0.011 | 0.047 | 0.047 |
| | | 5 | 0.007 | 0.046 | 0.046 |
| Vd | 80 nm Nano-Fe⁰/10% AlCl₃ in a fluidized bed, 1000 ppm | 1 | 0.0144 | 0.027 | 0.027 |
| | | 3 | 0.017 | 0.032 | 0.032 |
| | | 5 | 0.011 | 0.031 | 0.031 |

TABLE I-continued

Oxygen Scavenging Performance

| Ex. | Description | Days of ageing in G.C. vial | Dry Reactivity (ccO2 per gram polymer) | Wet Reactivity (ccO2 per gram polymer) | Wet Reactivity (ccO2 per gram polymer per 1000 ppm Scavenging composition) |
|---|---|---|---|---|---|
| VIa | 2.5 wt % AlCl₃ Dry Blend, 3000 ppm in PET | 3 | | 0.07 | 0.023 |
| VIc | 3000 ppm Freshblend ™ in PET | 1 | | 0.07 | 0.023 |
| | | 3 | | 0.16 | 0.053 |
| | | 10 | | 0.34 | 0.113 |
| VId | 8 Wt % NaCl on Fe, blended at 4000 ppm in PET | 10 | | 0.19 | 0.0475 |
| VIe | 10 Wt % NaHSO₄ on Fe, blended at 4000 ppm in PET | 10 | | 0.34 | 0.085 |

TABLE II

Bottle Data

| Example | Fe Composition | Hunter Haze (%) | L* | a* | b* |
|---|---|---|---|---|---|
| VIa | 2.5 wt % AlCl₃ Dry Blend, 3000 ppm in PET | 19.84 | | | |
| VIIa | Fe⁰/5% AlCl₃ in a fluidized bed (3000 ppm) in PET | 21 | 77.15 | −0.07 | 2.29 |
| VIIb | Fe⁰/5% AlCl₃ in a fluidized bed after SSP | | 77.13 | −0.11 | 2.93 |
| VIIc | 2.5 wt % AlCl₃ - Ethanol, 3000 ppm in PET, mixed at injection machine | 15.69 | 84.37 | 0.03 | 3.26 |
| VIId | 2.5 wt % AlCl₃ - Ethanol, 3000 ppm in PET after SSP | 18.27 | 83.58 | −0.13 | 3.26 |

Analytical Procedures

Accelerated Oxygen Absorbance Test—Polymer Samples

Bottle sidewall samples of the iron-containing compositions are cut to a predetermined size with a template and the sidewall sample weights are recorded to the nearest 0.01 g. The samples are placed into 20 ml gas chromatograph vials. The vials are either analysed dry or with activation. Activated (wet) samples are activated by placing 2 ml of aqueous 0.001 M acetic acid into the vial prior to being crimp sealed. The sidewall samples are stored at 50° C. The individual vials are analysed by gas chromatography for consumption of oxygen vs. a control at the prescribed time interval.

Intrinsic Viscosity

The intrinsic viscosity of intermediate molecular weight and low crystalline poly(ethylene terephthalate) and related polymers which are soluble in 60/40 phenol/tetrachloroethane was determined by dissolving 0.1 grams of polymer or ground pellet into 25 ml of 60/40 phenol/tetrachloroethane solution and determining the viscosity of the solution at 30° C.+/−0.05 relative to the solvent at the same temperature using a Ubbelohde 1B viscometer. The intrinsic viscosity is calculated using the Billmeyer equation based upon the relative viscosity.

The intrinsic viscosity of high molecular weight or highly crystalline poly(ethylene terephthalate) and related polymers which are not soluble in phenol/tetrachloroethane was determined by dissolving 0.1 grams of polymer or ground pellet into 25 ml of 50/50 trifluoroacetic Acid/Dichloromethane and determining the viscosity of the solution at 30° C. +/−0.05 relative to the solvent at the same temperature using a Type OC Ubbelohde viscometer. The intrinsic viscosity is calculated using the Billmeyer equation and converted using a linear regression to obtain results which are consistent with those obtained using 60/40 phenol/tetrachloroethane solvent. The linear regression is IV in 60/40 phenol/tetrachloroethane=0.8229×IV in 50/50 trifluoroacetic Acid/Dichloromethane+ 0.0124

The Hunter Haze Measurement

The measurements were taken through the bottle sidewalls. A HunterLab Color QUEST Sphere Spectrophotometer System equipped with an IBM PS/2 Model 50Z computer, IBM Proprinter II dot matrix printer, assorted specimen holders, and green, gray and white calibration tiles, and light trap was used. The HunterLab Spectrocolorimeter integrating sphere sensor is a colour and appearance measurement instrument. Light from the lamp is diffused by the integrating sphere and passed either through (transmitted) or reflected (reflectance) off an object to a lens. The lens collects the light and directs it to a diffraction grating that disperses it into its component wave lengths. The dispersed light is reflected onto a silicon diode array. Signals from the diodes pass through an amplifier to a converter and are manipulated to produce the data. Haze data is provided by the software. It is the calculated ratio of the diffuse light transmittance to the total light transmittance multiplied by 100 to yield a "Haze %" (0% being a transparent material, and 100% being an opaque material). Samples prepared for either transmittance or reflectance must be clean and free of any surface scratches or abrasion. The size of the sample must be consistent with the geometry of the sphere opening and in the case of transmittance; the sample size is limited by the compartment dimension. Each sample is tested in four different places, for example on the bottle sidewall or representative film area.

A Panametrics Magna-Mike 8000 Hall Effect Thickness Gauge was employed to measure the bottle sidewall thickness.

I claim:

1. A process for manufacturing oxygen scavenging particles wherein the particles comprise at least one oxidizable component and at least one activating component, and said process comprises contacting the oxidizable component with a gas containing a vapour of the activating component and depositing the activating component from the gas onto the oxidizable component in either a liquid or solid form and the oxidizable component is in the form of particles.

2. The process according to claim 1, wherein the activating component contains a halide.

3. The process according to claim 1, wherein the activating component is a metal halide.

4. The process according to claim 1, wherein the activating component is a protic solvent hydrolysable halogen compound.

5. The process according to claim 1, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

6. The process according to claim 1, wherein the activating component comprises at least one compound selected from the group consisting of $AlBr_3$, $AlCl_3$, $FeCl_2$ and $FeCl_3$.

7. The process according to claim 1, wherein the activating component comprises at least one compound selected from the group consisting of $AlCl_3$ and $AlBr_3$.

8. The process according to claim 1 wherein the oxidizable component comprises at least one compound selected from the group consisting of an oxidizable metal and oxidizable metal alloy.

9. The process according to claim 1 wherein the oxidizable component comprises an oxidizable metal selected from the group consisting of iron, aluminum, copper, zinc, manganese, and magnesium.

10. The process according to claim 9, wherein the activating component contains a halide.

11. The process according to claim 9, wherein the activating component is a metal halide.

12. The process according to claim 9, wherein the activating component is a protic solvent hydrolysable halogen compound.

13. The process according to claim 9, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

14. The process according to claim 9, wherein the activating component comprises at least one compound selected from the group consisting of $AlBr_3$, $AlCl_3$, $FeCl_2$ and $FeCl_3$.

15. The process according to claim 9, wherein the activating component comprises at least one compound selected from the group consisting of $AlCl_3$ and $AlBr_3$.

16. The process according to claim 9, wherein the oxidizable component comprises iron.

17. The process according to claim 16, wherein the activating component contains a halide.

18. The process according to claim 16, wherein the activating component is a metal halide.

19. The process according to claim 16, wherein the activating component is a protic solvent hydrolysable halogen compound.

20. The process according to claim 16, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

21. The process according to claim 16, wherein the activating component comprises at least one compound selected from the group consisting of $AlBr_3$, $AlCl_3$, $FeCl_2$ and $FeCl_3$.

22. The process according to claim 16, wherein the activating component comprises at least one compound selected from the group consisting of $AlBr_3$ and $AlCl_3$.

23. The process according to claim 1 wherein the oxidized form of the oxidizable component is reduced from a higher oxidation state in a chamber selected from the group consisting of the same chamber in which the oxidizable component is brought in contact with the activating component and a chamber connected to the chamber in which the oxidizable component is brought in contact with the activating component.

24. The process according to claim 23, wherein the activating component contains a halide.

25. The process according to claim 23, wherein the activating component is a metal halide.

26. The process according to claim 23, wherein the activating component is a protic solvent hydrolysable halogen compound.

27. The process according to claim 23, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

28. The process according to claim 23, wherein the activating component comprises at least one compound selected from the group consisting of $AlBr_3$, $AlCl_3$, $FeCl_2$ and $FeCl_3$.

29. The process according to claim 23, wherein the activating component comprises at least one compound selected from the group consisting of $AlBr_3$ and $AlCl_3$.

30. The process according to claim 23 wherein the oxidizable component comprises at least one compound selected from the group consisting of an oxidizable metal and oxidizable metal alloy.

31. The process according to claim 23 wherein the oxidizable component comprises at least one compound selected from the group consisting of an oxidizable metal and metal alloy wherein at least one metal is selected from the group consisting of iron, aluminum, copper, zinc, manganese, and magnesium.

32. The process according to claim 31, wherein the activating component contains a halide.

33. The process according to claim 31, wherein the activating component is a metal halide.

34. The process according to claim 31, wherein the activating component is a protic solvent hydrolysable halogen compound.

35. The process according to claim 31, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

36. The process according to claim 31, wherein the activating component comprises $AlBr_3$, $AlCl_3$, $FeCl_2$ and $FeCl_3$.

37. The process according to claim 31, wherein the activating component comprises at least one compound selected from the group consisting of $AlBr_3$ and $AlCl_3$.

38. The process according to claim 23, wherein the oxidizable component comprises iron.

39. The process according to claim 38, wherein the activating component contains a halide.

40. The process according to claim 38, wherein the activating component is a protic solvent hydrolysable halogen compound.

41. The process according to claim 38, wherein the activating component comprises at least one compound selected from the group consisting of $AlCl_3$, $FeCl_2$, $FeCl_3$, $TiCl_4$, $POCl_3$, $SnCl_4$, $SOCl_2$, n-Butyl $SnCl_3$, and $AlBr_3$.

42. The process according to claim 38, wherein the activating component comprises at least one compound selected from the group consisting of $AlBr_3$, $AlCl_3$, $FeCl_2$ and $FeCl_3$.

43. The process according to claim 38, wherein the activating component comprises at least one compound selected from the group consisting of $AlBr_3$ and $AlCl_3$.

44. The process of claim 1 wherein the oxidizable component comprises iron and the activating component comprises $AlCl_3$.

45. The process of claim 1 wherein the oxidizable component consists essentially of iron and the activating component consists essentially of $AlCl_3$.

* * * * *